United States Patent [19]

Kumar et al.

[11] Patent Number: 4,990,996
[45] Date of Patent: Feb. 5, 1991

[54] BONDING PAD SCHEME

[75] Inventors: Niraj Kumar, Milpitas; Steven R. Boyle, Santa Clara, both of Calif.

[73] Assignee: Zilog, Inc., Campbell, Calif.

[21] Appl. No.: 134,921

[22] Filed: Dec. 18, 1987

[51] Int. Cl.[5] ............................................. H01L 23/48
[52] U.S. Cl. ...................................... 357/68; 357/70; 357/74; 357/65
[58] Field of Search ................ 357/68, 70, 74, 65, 357/45 M

[56] References Cited

U.S. PATENT DOCUMENTS

| 4,688,070 | 8/1987 | Shiotari ................................. 357/40 |
| 4,860,087 | 8/1989 | Matsubara et al. ................... 357/68 |
| 4,934,820 | 6/1990 | Takahashi et al. ..................... 357/70 |

FOREIGN PATENT DOCUMENTS 60-98652  6/1985  Japan ................................. 357/68
60-103631 7/1985 Japan ................................. 357/68

Primary Examiner—Andrew J. James
Assistant Examiner—Courtney A. Bowers
Attorney, Agent, or Firm—Fliesler, Dubb, Meyer & Lovejoy

[57] ABSTRACT

A technique is disclosed for manufacturing an integrated circuit die which is capable of being packaged in any of two or more different package types having different arrangements of bonding posts. The circuit is laid out with redundant pads located at different places on the die so that one pad in each pair of redundant pads is accessible for bonding with posts in one package type, while the other pad in each pair of redundant pads is accessible for bonding with posts in another package type. Illustrative layouts are shown whereby various types of pads, e.g., power pads, signal input pads, signal output pads and bidirectional I/O pads, may be made redundant.

3 Claims, 6 Drawing Sheets

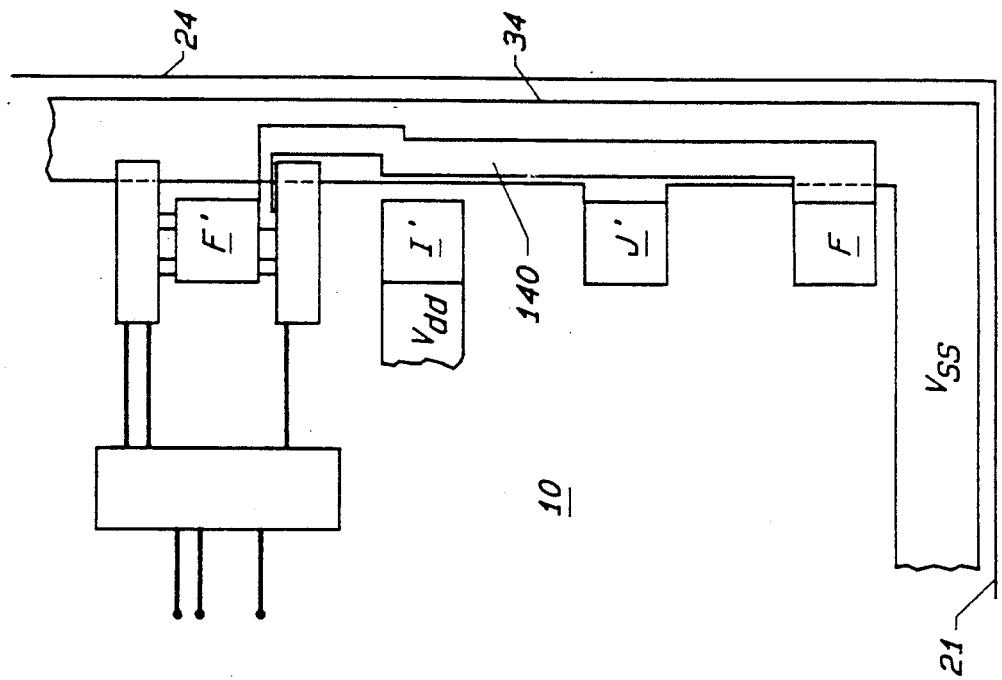
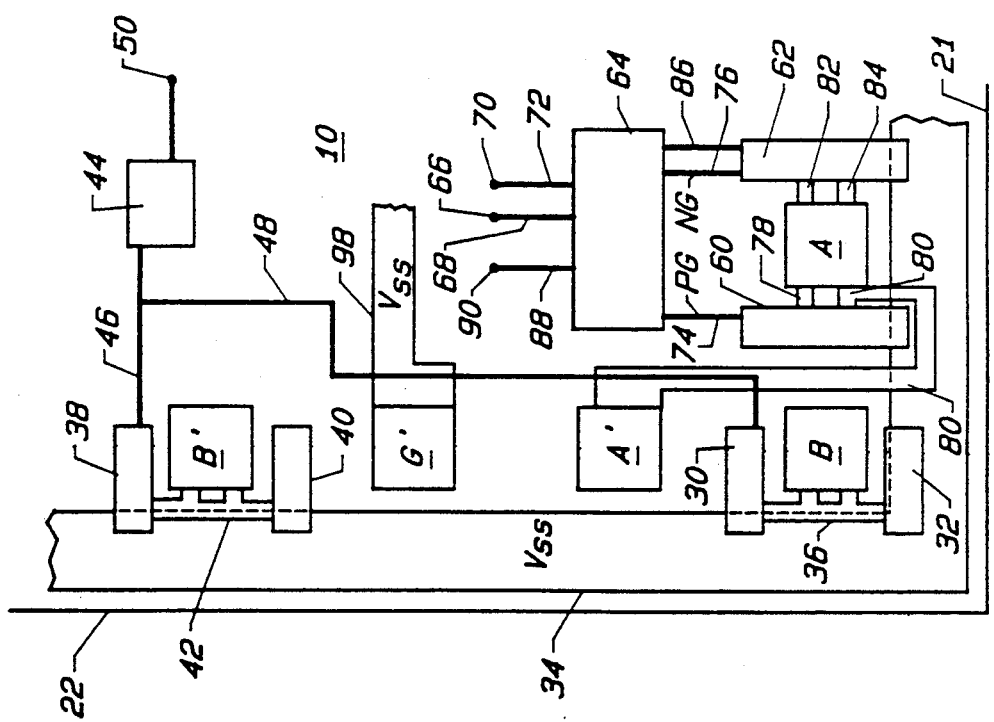
FIG. 2B
FIG. 2A

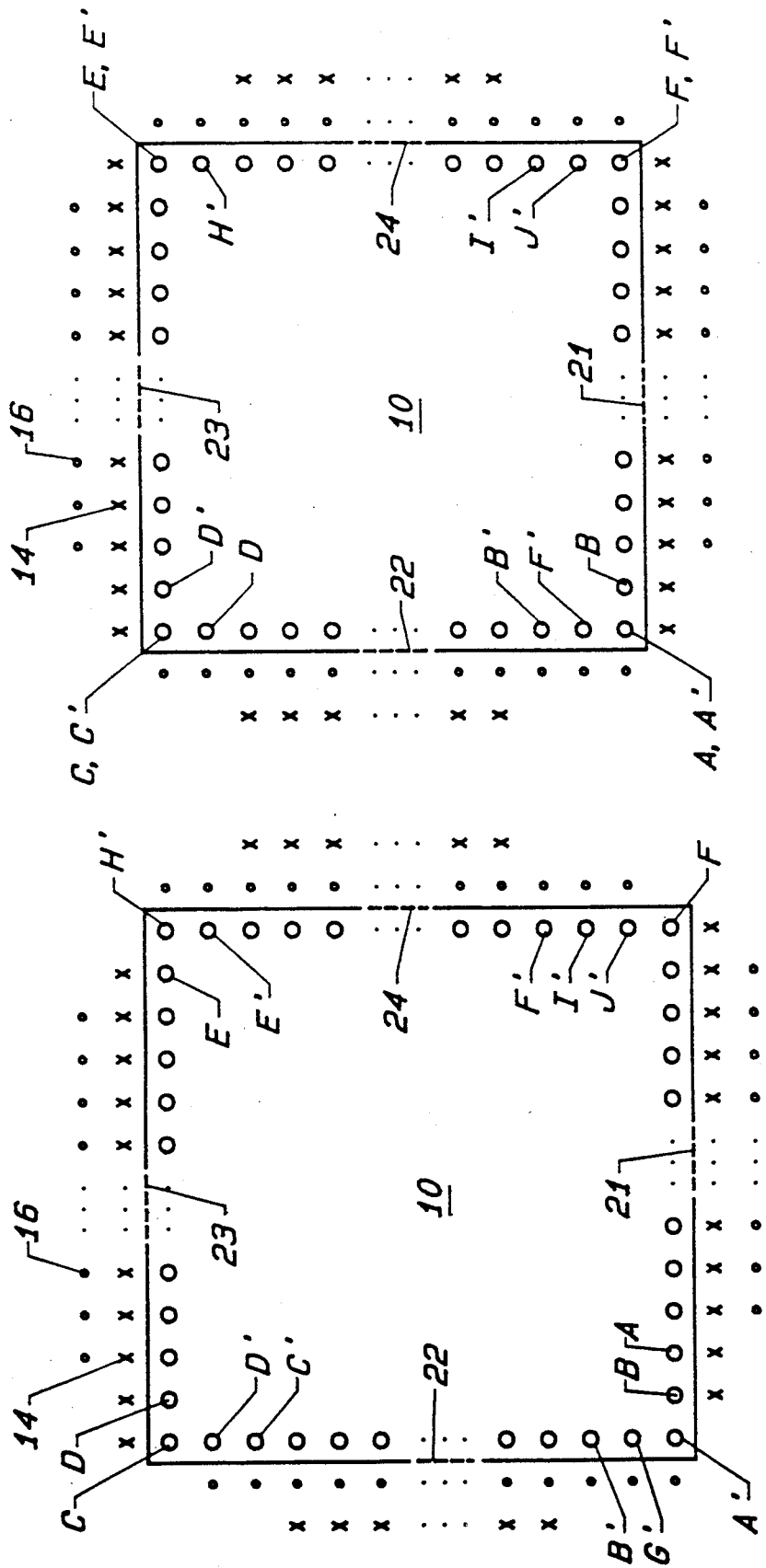

BONDING PAD SCHEME

BACKGROUND OF THE INVENTION

1. Field of the Invention

The invention relates to integrated circuit packaging schemes, and more particularly to a scheme by which a die fabricated according to a single layout can be packaged in either of two or more different package types.

2. Description of Related Art

When an integrated circuit die is to be packaged in an integrated circuit package, the die is typically placed in the center of a lead frame consisting of a plurality of leads extending radially from the position where the die is placed. The inside ends of these radially extending leads are referred to for historical reasons as bonding posts, even though they may not actually look like posts once the package is completed. Extremely thin wires are then typically bonded between each of the posts and corresponding bonding pads which are integrated along the four sides of the die.

If the package is to be plastic, the die/lead frame assembly is then placed in a mold and hot plastic is injected in. Since the hot plastic is fairly viscous, it tends to sweep the wires somewhat in the direction in which the plastic is traveling. If the wires get too close to each other, they will short. Thus it is highly undesirable to run a bonding wire from a pad on one side of the die to a bonding post on a different side of the die. For example, it is usually considered too risky to run a wire from one side of the die to the side of posts facing a different but adjacent side of the die, even if the pad is right next to the corner pad between the two sides. If the package is to be ceramic or cerdip, the top and bottom halves of the package are placed around the die/lead frame assembly and fixed into place. The risk of shorting wires is not as great in ceramic packages as it is in plastic packages, but it is nevertheless still considered undesirable to run a wire from a pad on one side of the die to a post on any other side of the die.

Recent years have seen a proliferation of different package types, including dual in-line packages (DIPs), quad in-line packages (QIPs), quad flat packs (QFPs), plastic leaded chip carriers (PLCCs) and pin grid arrays (PGAs). All of these packages are available with different standard numbers of pins on a side, and consequently, different numbers of bonding posts on each side of the die. Some packages, such as TO-type packages, even have their bonding posts arranged in a circle around the die. Moveover, to further complicate the bonding process, many new package and die designs permit very large numbers of connections between the die and the outside world. Most of the package types are available only in standard sizes with fixed pin counts.

For various important marketing and/or applications reasons, a manufacturer may desire to produce a particular integrated circuit design in particular ones of these packages. Often it is desirable to produce the circuit in several types of packages, in order to give the customer a choice. Thus, for example, the manufacturer may choose to offer a particular integrated circuit both in an 80-pin QFP and an 84-pin PLCC. (PLCC's are generally not available with 80 pins.) The lead frames for both these packages are arranged to have bonding posts on all four sides of the die, but the number of bonding posts located on one side of the die in one package is different than the number of bonding posts located on the same side of the die in the other package. For the 80-pin QFP, the posts are arranged in a $16 \times 24$ post rectangle, whereas in the 84-pin PLCC, they are arranged in a $21 \times 21$ post rectangle.

If the integrated circuit requires, for example, 80 connections to the outside world, then the same die design cannot be used in both packages. If the die is to be packaged in the 80-pin QFP, then the pads must be integrated thereon in a $16 \times 24$ pad format. Any other arrangement would require a wire to be bonded from a pad on one side of the die to a post on a different side of the die. But if the same die is packaged in the 84-pin PLCC, some of the bonding posts located on a 16-pad side of the die would have no immediately facing pad, and would have to be wire bonded with a pad located on the 24-pad side of the die. Thus it can be seen that the same die usually cannot be packaged in more than one different package type.

In the past, the typical solution to the above problem would have been to manufacture dies with a different layout for each desired package type. This cannot be accomplished easily. Merely moving pads from one side of the die to an adjacent side is impractical because usually there is not enough room on the destination side to accommodate more pads. Instead, a significant circuit re-layout task usually must be done to make the die fit each package in which the circuit is to be offered.

The problem of having to manufacture a different die type for each desired package type has a number of important consequences. First, merely generating a new mask set is a very expensive proposition. Second, the development work required to generate a new layout is expensive and time consuming. Thus, either the marketing decision as to which package tYpe will be used must be made long before the product will actually be available to the market, or a duplicate design effort must be undertaken. Third, a new layout must be debugged entirely independently of the old, must be independently checked for design rule compliance, and risks having electrical properties which differ from those of the old layout. Fourth, the manufacture of a second die type requires additional processing, tooling, handling and inventory than would be required for a single die type.

Other Art

The Texas Instruments 2532 EPROM was offered in either of two package types. The two versions had the same number of external pins and the same arrangement of internal bonding posts, but nevertheless had a slightly different wire bonding configuration because of different cavity sizes. In the first package, a first ground pad on the die was wire bonded to the ground post, and a second wire was down bonded from the ground post to the die attach metal to connect this metal to ground. A second ground pad on an adjacent side of the die was left unconnected to any bonding post. A die with the same layout was used in the second package, but the cavity was shaped differently so as to leave no room for down bonding from the ground post. When the die was packaged in the second package type, therefore, it was the second ground pad which was used for down bonding.

While this was a situation where a single die was packaged in either of two types of packages, the two package types were not "different" in the sense that the number of bonding posts on each side of the die cavity in the first package was not different from the number of bonding posts on the corresponding side of the die cavity in the second package. The Texas Instruments part therefore does not solve, or attempt to solve, the problem set forth above.

The Zilog Z8 microcontroller was available in either a 40-pin package or a 28-pin package. The dies housed in these packages were identical, the only differences being that twelve of the pads carrying input and output signals were left unbonded in the 28-pin package. This also did not solve or attempt to solve the above-described problem, since the bonding wires had substantially the same direction and spacing in both packages; the risk of shorting was not substantially greater in either package. Moreover, the twelve pads left unbonded in the 28-pin package resulted, intentionally, in reduced functionality of the integrated circuit. No other pads or pins were available to perform the functions of the unbonded pads.

Several other products available on the market incorporate a feature known as "design for testability." These products have a die layout with several extra pads which are useful only for certain testing applications. These extra pads are typically used for probing the die, but are left unbonded when the die is housed in the ordinary production package. Like the Z8, these products neither solve nor attempt to solve the above-described problem.

It is therefore an object of the present invention to provide a scheme by which a single integrated circuit die can be packaged in either of two or more package types having different arrangements of posts relative to the die position.

SUMMARY OF THE INVENTION

The above object and others are achieved according to the present invention by integrating onto the die redundant pads accessible to wire bonding with bonding posts having different arrangements corresponding to different package types. Redundant pads may be located on different sides or elsewhere on the die. If the die is then packaged in a first type of package, which for example has rectangularly aranged posts, and has more posts on a first side of the die than a second package type has on the first side of the die, then those of the redundant pads which are accessible to wire bonding with posts on the first side of the die will be used while the corresponding pads on the second side remain unbonded. If the die is packaged in a package of the second type, which for example also has rectangularly arranged posts, and has fewer posts along the first side of the die than the first package has but more posts along the second side of the die than the first package has, then those of the redundant pads which are accessible to bonding posts on the second side of the die will be used while the corresponding pads on the first side remain unbonded.

Advantageously, but not necessarily, the pads integrated onto each side of the die are organized into a central group of common pads and two groups of contiguous supplemental pads disposed adjacent to the corners of the die, where the pads in a given supplemental group have their counterpart pads in the nearest supplemental group on the adjacent side of the die. Also advantageously, but not necessarily, the pads in the given supplemental group have their corresponding pads in the adjacent supplemental group in the same sequence, counting clockwise around the die, as they exist in the given supplemental group.

If the number of pins in the first package exceeds the number of pins in the second package, then extra pads may be provided to bring the total number of pads up to the total number of pins in the larger pin count package. These extra pads would be bonded to posts in the larger pin count package but left unbonded in the smaller pin count package. Advantageously, they can also duplicate power supply pads located elsewhere on the die.

In one embodiment of the invention, the die has integrated thereon a digital integrated circuit having signal input nodes, signal output nodes and power nodes (including ground) to be coupled to bonding posts and accessible externally to the package. If a pair of redundant pads are to be connected to a power node, then the two pads may be connected together directly using a heavy metalization. The same is true if the redundant pads carry a digital signal output; the output drivers should not be repeated. If the redundant pads carry a digital signal input, then they are both coupled to the input of a single shared input buffer using conduction means which need not carry large currents. Pad-specific electrostatic discharge protection means, such as high current diodes disposed near the pads and coupled between the pads and power nodes, are repeated for the two redundant input pads. If the redundant pads carry bidirectional I/O signals, then the two pads may be connected together using a heavy metalization with no repetition of circuit components.

BRIEF DESCRIPTION OF THE DRAWINGS

The invention will be described with respect to particular embodiments thereof and reference will be made to the drawings, in which:

FIGS. 2A-2D show enlargements of the layout of various structures located near relevant pads shown on the die in FIG. 1;

FIGS. 4A-4D are symbolic representations of other embodiments of the invention.

DETAILED DESCRIPTION

Figure 1:
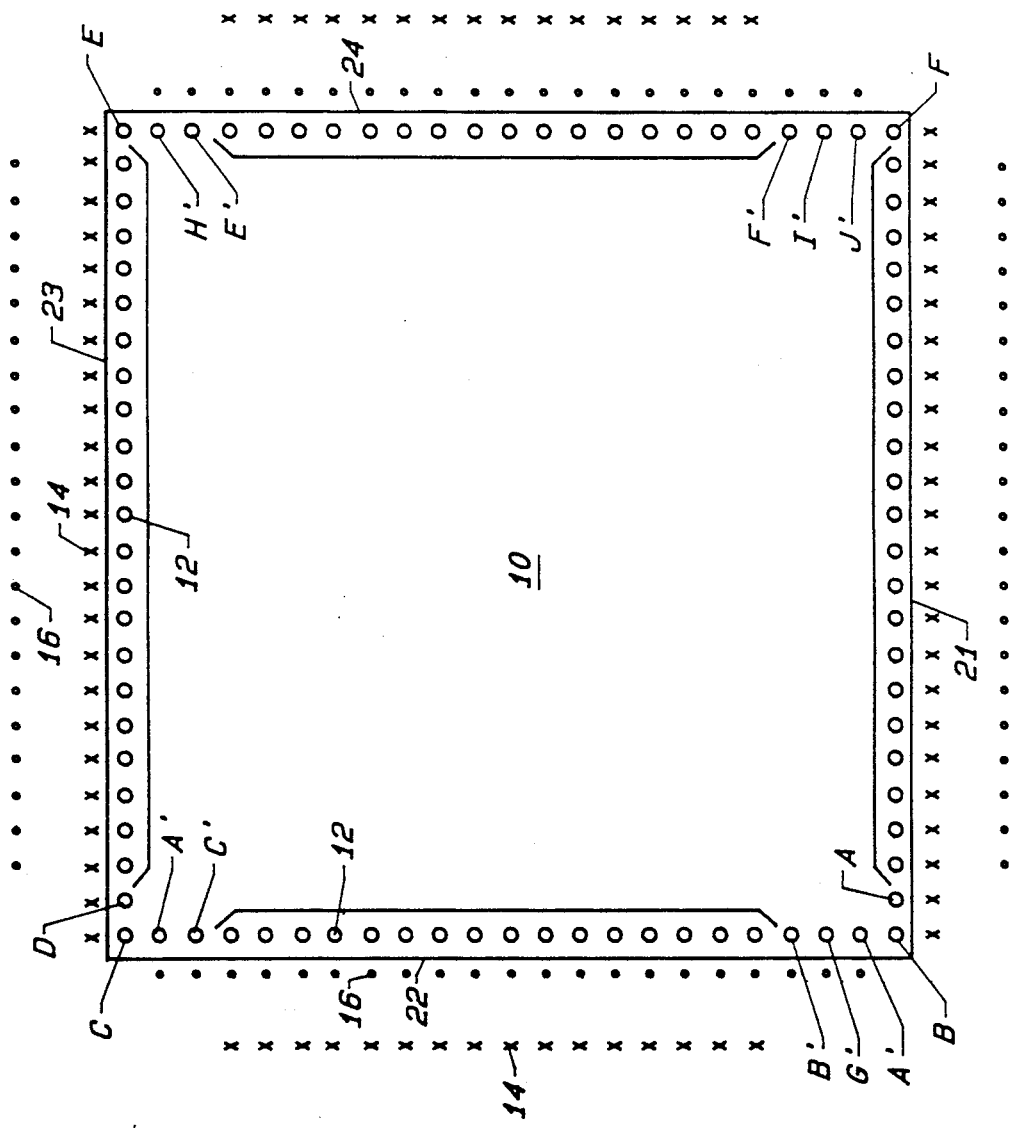
FIG. 1 is a symbolic representation of a die manufactured according to the invention, showing the relationship of pads on the die with posts on each of two packages.

In FIG. 1 there is shown a symbolic representation of an integrated circuit die 10 having a plurality of bonding pads 12 disposed around the edges of the die 10. The die 10 is adapted according to the invention to be packaged either in an 80-pin QFP, having bonding posts arranged around the die cavity in a 16-×24-post rectangle, or in an 84-pin PLCC, having bonding posts arranged around the die cavity in a 21-×21-post rectangle. The posts for the 80-pin package are shown symbolically in FIG. 1 as X's 14 and the posts for the 84-pin package are shown as dots 16.

For convenience, the four sides of the die 10 as shown in FIG. 1 will be referred to herein as sides 21, 22, 23, and 24 proceeding clockwise beginning with the side shown at the bottom of the figure.

In the corner between the sides 21 and 22 of the die 10 there are 5 pads labeled, in clockwise sequence, A, B, A', G' and B'. The pads A and B are on the side 21 whereas the pads A', G' and B' are on side 22. These pads are referred to herein as supplemental pads for reasons which will become apparent. Located near the corner between sides 22 and 23 are additional supplemental pads C' and D' (located on side 22), and C and D (located on side 23), again reading clockwise. Located near the corner between sides 23 and 24 are three additional supplemental pads E (located on the side 23), H' and E' (located on the side 24). Near the corner between sides 24 and 21 are four still additional supplemental pads labeled, clockwise sequentially F', I' and J' (on side 24) and F (on side 21). Though not shown, the die has integrated thereon a CMOS circuit fabricated using a double level metal process.

Figure 2D:
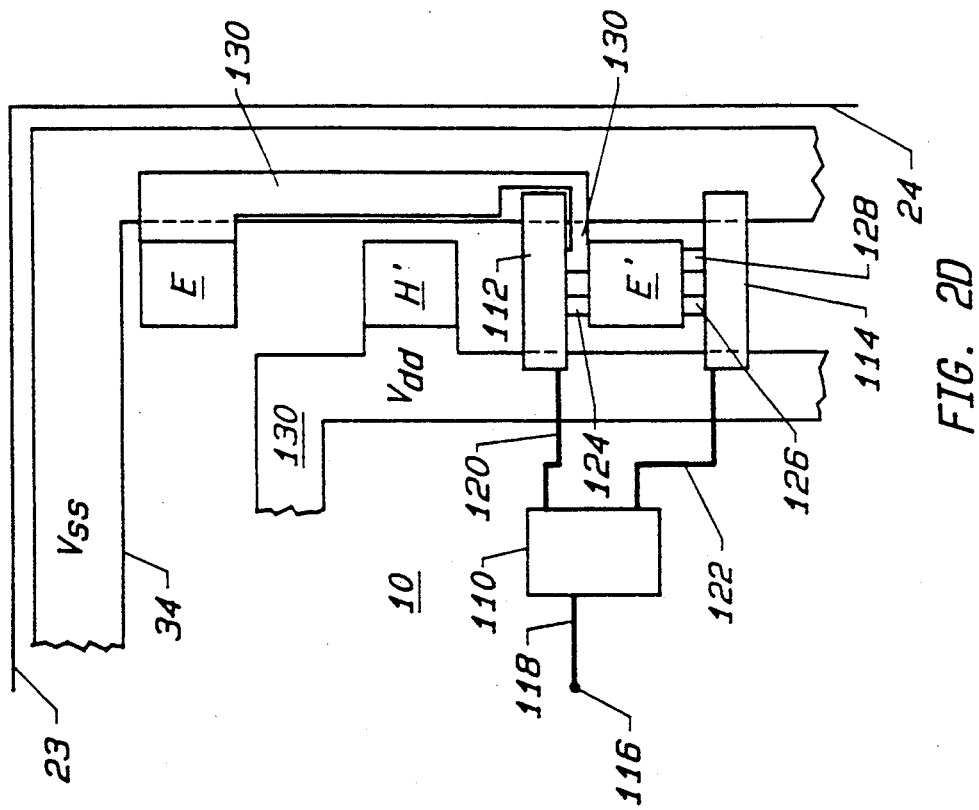

FIGS. 2A, 2B, 2C and 2D show the layout of the supplemental pads on die 10, along with associated circuitry and interconnects, in an enlarged view. FIG. 2A shows the supplemental pads A, B, A', G' and B'. Pads A and A' are redundant bidirectional I/O pins and pads B and B' are redundant pads for carrying an input signal. Referring first to pad B, a pair of electrostatic discharge (ESD) diodes 30 and 32 are shown flanking the pad. The diode 30 has its cathode connected to Vdd by a means not shown, and the diode 32 has its anode connected to a ground (Vss) conductor 34. The ground conductor 34, in addition to providing a ground node throughout the integrated circuit, also surrounds the entire die at its edges. The anode of the diode 30 and the cathode of the diode 32 are connected together and to the pad B by a metalization 36.

The pad B', like the pad B, is flanked by two diodes 38 and 40. The cathode of the diode 38 is connected to Vdd by means not shown, and the anode of diode 40 is connected to ground ring 34. The anode of diode 38 is connected to the cathode of diode 40, and both are connected to the pad B', by a metalization 42. The output of the ESD protection means 38, 40 and 42 for pad B' is connected to an input buffer 44 via a metalization 46. The output of ESD protection means for pad B is connected to the metalization 46 via a metalization 48. The output of the input buffer 44 is connected to a signal input circuit node shown symbolically as 50.

The layout of the integrated circuit on the die 10 was designed using a CAD system which has various blocks of frequently used circuit combinations predefined. One of the predefined blocks is that used for most signal input pads on the die, including pad B'. It constitutes the pad itself, the ESD protection diodes 38 and 40, the metalizations 42 and 46, the input buffer 44, as well as associated interconnects not shown. The use of such building blocks in a CAD designed layout is well established in the industry. However, for the purpose of the redundant pad B, it was found desirable to repeat only the ESD protection, and not the input buffer. Combining the signal from the two redundant pads B and B' prior to the input buffer 44 saves space on the die that would normally be occupied by a second input buffer, but repetition of the ESD protection means permits the use of an interconnect such as 48 having no unusually large current-carrying capacity. In order to lay out the appropriate mask work associated with pad B, the designers extracted from the predefined CAD block only the pad B, the ESD protection diodes 30 and 32 and the metalization 36.

It should be noted that the ESD protection diodes for pads B and B' constitute ESD protection means which are pad-specific. That is, they each are intended to protect against ESD currents entering one particular pad, though they may secondarily help protect against ESD currents entering elsewhere. The die may also include generalized ESD protection means which helps protect against ESD currents entering in any of several places.

Figure 3A:
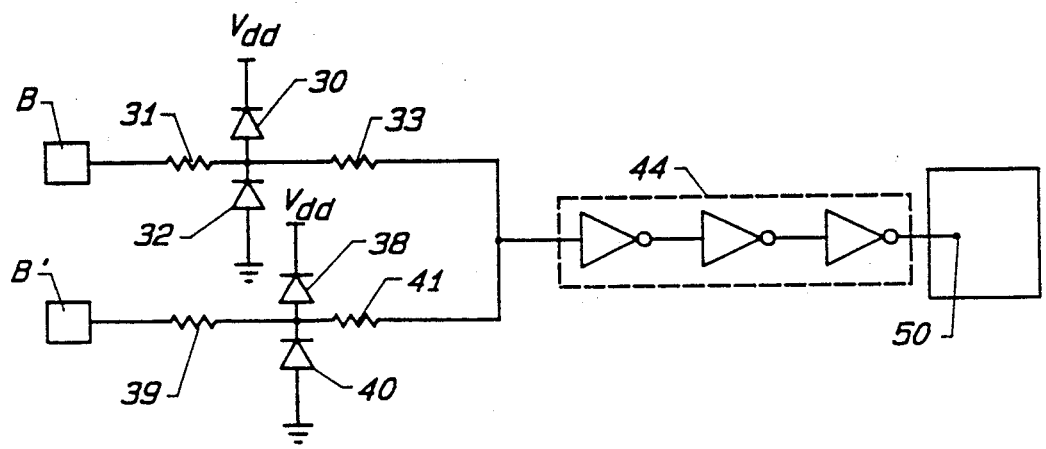
FIGS. 3A-3C are circuit schematics showing the electronic functions of structures shown in FIGS. 2A-2D.

FIG. 3A is a circuit schematic showing how the two redundant pads B and B' are coupled ultimately to the input signal circuit node 50. The pad B is coupled to the junction between the anode of diode 30 and cathode of diode 32, and then on to the input of input buffer 44. The cathode of diode 30 is connected to Vdd and the anode of diode 32 is connected to ground. Similarly, the pad B' is coupled to the junction between the anode of diode 38 and the cathode of diode 40, and then on to the input of input buffer 44. The cathode of diode 38 is connected to Vdd and the anode of diode 40 is connected to ground. The resistors 31, 33, 39 and 41 shown in FIG. 3A also help improve ESD protection, and integral with the circuit structures which form diodes 30, 32, 38 and 40.

The input buffer 44 in the present circuit contains a series of three specialized inverters for performing a level shifting function so that an input signal at TTL levels can be used with the CMOS circuit. It will be understood, however, that any form of input buffer, or even a simple interconnect if no buffering is required, could be used to connect the output of the ESD protection means for pad B and the output of ESD protection means for pad B' to the signal input circuit node 50. The term "input circuitry" is intended to refer to all of these possibilities.

The pads A and A' are redundant pads for carrying a bidirectional I/O signal. Like the input pad circuitry, the layout for I/O pads is also available within the CAD system as a single predefined block. Referring to pad A, this block includes the pad itself, output driver transistors 60 and 62, and circuitry block 64, together with appropriate interconnects. A signal output node 66, internal to the CMOS circuit, is connected to an input of the circuitry block 64 by a conductor 68. An output enable node 70 is also connected to an input of the circuitry block 64 via an interconnect 72. The output portion of circuitry block 64 provides signal conditioning for the output signal, and provides a PGATE signal on an interconnect 74 to the gate of P-channel output driver transistor 60. It also provides an NGATE signal on interconnect 76 to the gate of N-channel transistor 62. The source of P-channel driver transistor 60 is connected to Vdd by means not shown and the source of N-channel driver transistor 62 is connected to the ground ring 34. The drains of both transistors 60 and 62 are connected to the pad A via metalizations 78, 80, 82 and 84. Metalizations 82 and 84 are also connected to an input of the circuitry block 64 via an interconnect 86. Circuitry block 64 provides input buffering for a signal arriving on this interconnect 86, and provides the input signal on an interconnect 88 to the internal input signal node 90. Input ESD protection is not required for a bidirectional I/O pad, since that function is provided by the driver transistors 60 and 62.

The redundant pad A' does not have any of the circuitry associated with a bidirectional I/O pad, but is instead connected directly to the pad A via the interconnect 80. This is considered more advantageous than a duplication of the entire bidirectional I/O CAD block since it saves space, even though the designer does not have the simplicity of simply using the CAD block as is. The arrangement shown in FIG. 2A is also considered advantageous over an arrangement which uses a common circuitry block 64 but duplicate output driver transistors such as 60 and 62, because among other things, three separate conductors (74, 76 and 86) are required to connect the circuitry block 64 to the output driver transistors. If the output driver transistors were repeated next to pad A', then all three of these conductors would have to be extended and routed also to the redundant set of driver transistors.

The conductor 80 shown in the arrangement in FIG. 2A should be capable of carrying relatively large currents for two reasons. First, when the pads A and A' are being used as an output, the conductor 80 should be able to accommodate a heavy output current generated by driver transistors 60 and 62. Secondly, the conductor 80 should be able to safely carry to the distant driver transistors 60 and 62 any ESD currents which enter the pad A'.

Figure 3C:
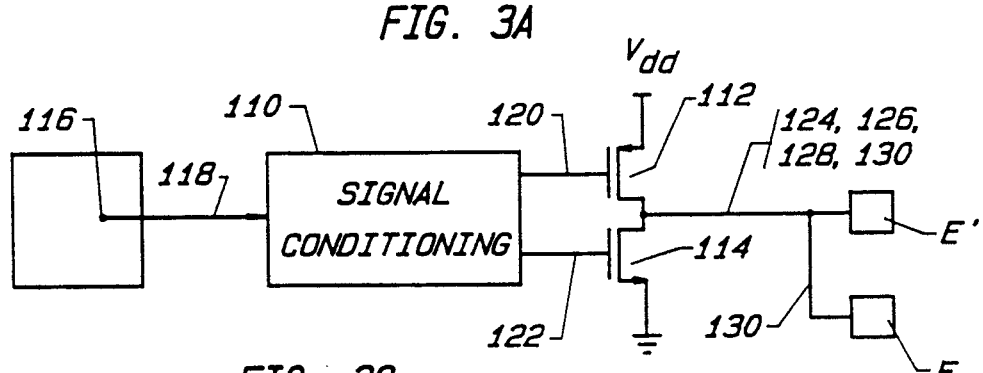
Figure 3B:
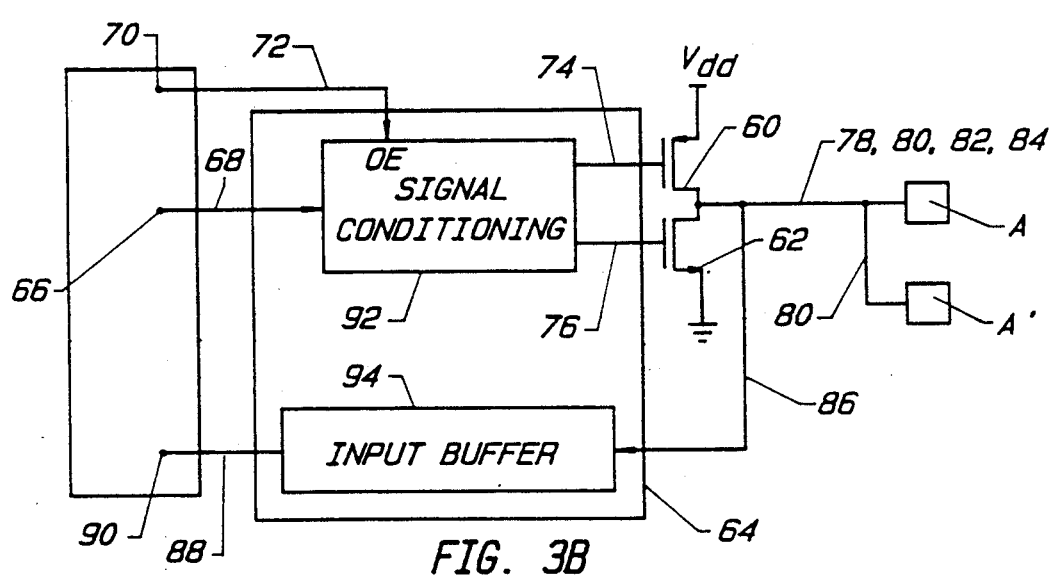

A circuit schematic for the circuitry associated with the redundant pads A and A', is shown in FIG. 3B. With respect to the circuitry block 64, it can be seen that the functions of the block may be divided into two separate circuits: a signal conditioning circuit 92 for conditioning the output signal arriving from node 66, and generating the PGATE and NGATE signals on interconnects 74 and 76; and input circuitry 94 similar to the input circuitry 44 in FIG. 3A. Alternatively, the two functions can be combined into a single circuit 64.

The supplemental pad G' in FIG. 2A is an extra pad, and is connected via a heavy conductor 90 to Vss. At least one other pad elsewhere on the die is connected to Vss and gets wire-bonded to a post on the package; it will be seen that pad G' gets wire-bonded to a post only if the die is packaged in the 84-pin package.

FIG. 2D shows the supplemental pads E, H' and E'. Pads E and E' carry redundant digital signal outputs. The circuitry associated with output pad E' is also laid out using a standard CAD block, and consists of output conditioning circuitry 110, output driver transistors 112 and 114, and associated interconnects. A digital signal output node 116 is connected to the input of the signal conditioning circuitry 110 via an interconnect 118, and the signal conditioning circuitry 110 generates a P-gate signal on an interconnect 120 and an N-gate signal on an interconnect 122. These interconnects are connected respectively to the gates of P-channel driver transistor 112 and N-channel driver transistor 114. Like bidirectional I/O pad A, the drains of driver transistors 112 and 114 are connected to the pad E' via metalizations 124, 126, 128 and 130. Metalization 130 additionally extends around the driver transistor 112 and makes a relatively high current capacity connection to the redundant pad E. The redundant pad E includes no repeated circuitry normally associated with an output pad. The metal extension 130 is designed to be able to carry a relatively large current, for all the same reasons that the metal extension 80 in FIG. 2A is so designed. The circuit schematic for the circuitry associated with redundant output pads E and E' is shown in FIG. 3C.

Also shown in FIG. 2D is an extra pad H' connected via a heavy metalization 130 to Vdd. At least one other pad elsewhere on the die is connected to Vdd and gets wire-bonded to a post on the package; it will be seen that pad H' gets wire-bonded only if the die is packaged in the 84-pin package.

FIG. 2B shows the supplemental pads F, F', I' and J'. Supplemental pads F and F' carry redundant bidirectional I/O signals, and the CAD block for such a pad is located next to the F' pad. Like the bidirectional I/O pads A and A', the redundant pad F is connected directly to the pad F' by a heavy metal extension 140. The extra pads I' and J' are connected via heavy conductors to Vdd and Vss respectively.

Figure 2C:
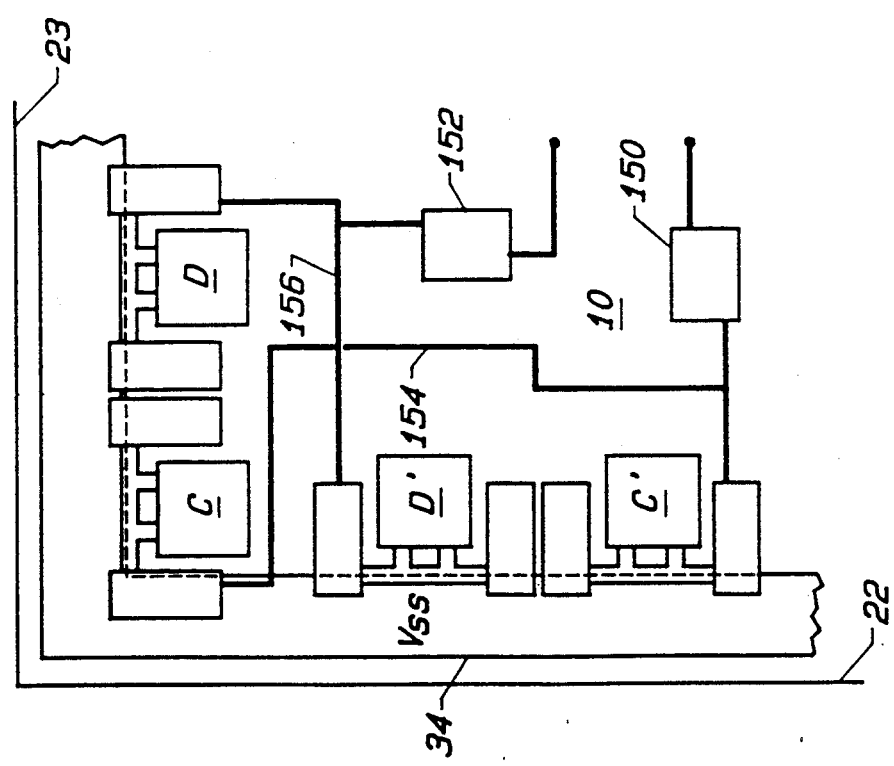

FIG. 2C shows the supplemental pads C, D, C' and D'. All carry digital signal inputs, pad C being redundant with pad C' and pad D being redundant with pad D'. Only one input buffer 150, 152 is associated with each of such redundant pairs C-C' and D-D' respectively; but ESD protection is repeated for each of the four pads. Like the redundant pad combination B and B' (FIG. 2A), the outputs of the ESD protection means for the C and C' redundant pair are connected together with interconnect 154. The outputs of the ESD protection for the D and D' redundant pair are connected together with interconnect 156.

In addition to the digital signal input, output and bidirectional I/O pads described above, it will be understood that any other type of pad may also be made redundant. This includes power pads, which can be made redundant merely by connecting them to the appropriate power nodes on the die via heavy metalizations.

As previously stated, the die 10 can be packaged in either of the two package types described earlier and this can be accomplished without having to put bonding wires from pads on one side of the die to posts on a different side of the die. When the die is to be packaged in the 80-pin package, with posts arranged on the lead frame in a 16-×24-post rectangle, all of the pads on sides 21 and 23 of the die 10 are bonded but only some of the pads on sides 22 and 24 are bonded. Referring again to FIG. 1, it can be seen that each of the pads located on sides 21 and 23 face an "X" post 14 for the 80-pin package. Only some of the pads on sides 22 and 24 face an "X" post 14. Therefore, when the die 10 is packaged in the 80-pin package, only those pads which have facing posts are connected. The remaining pads, specifically supplemental pads A', B', C', D', E', F', G', H', I', J', are left unbonded. This is, not a problem with respect to pads A', B', C', D', E' and F' since they are all redundant with respective pads A, B, C, D, E, and F as previously explained (FIGS. 2A-2D). Only one of each redundant pair of pads need be connected to the outside world, since connection to either achieves all the same functions as connection to the other. With respect to extra pads G', H', I' and J', these pads carry only power (Vdd and Vss). The chip is laid out so that all the necessary power connections are available from other pads which are wire bonded in both packages.

If the chip is packaged in the 84-pin package, then all the pads on sides 22 and 24 can be wire bonded to nearby posts. But, like sides 22 and 24 in the 80-pin package, not all the pads on sides 21 and 23 have corresponding nearby posts in the 84-pin package. Supplemental pads A, B, C, D, E and F are therefore left unbonded. Again, however, this is not a problem since each of these has a redundant counterpart pad, respectively A', B', C', D', E' and F', on an adjacent side, which are connected to the outside world. As previously explained, connection to these pads achieves all the same functions as connection to the unconnected pads would have accomplished.

Supplemental pads G', H', I' and J' are extra pads connected to power nodes on the die. These pads are present only because the PLCC has more pins than the QFP, and would not be present if the total number of pins were the same for each package contemplated for the die. Since the extra leads are available on one of the packages, it is considered advantageous to connect them to power nodes on the die since one can never have too many power connections between the die and the external world. However, other power connections should also be included on the chip and laid out with sufficient current carrying capability to ensure proper circuit operation in case the die is used in the lower-pin-count package.

Figures 4A, 4B:
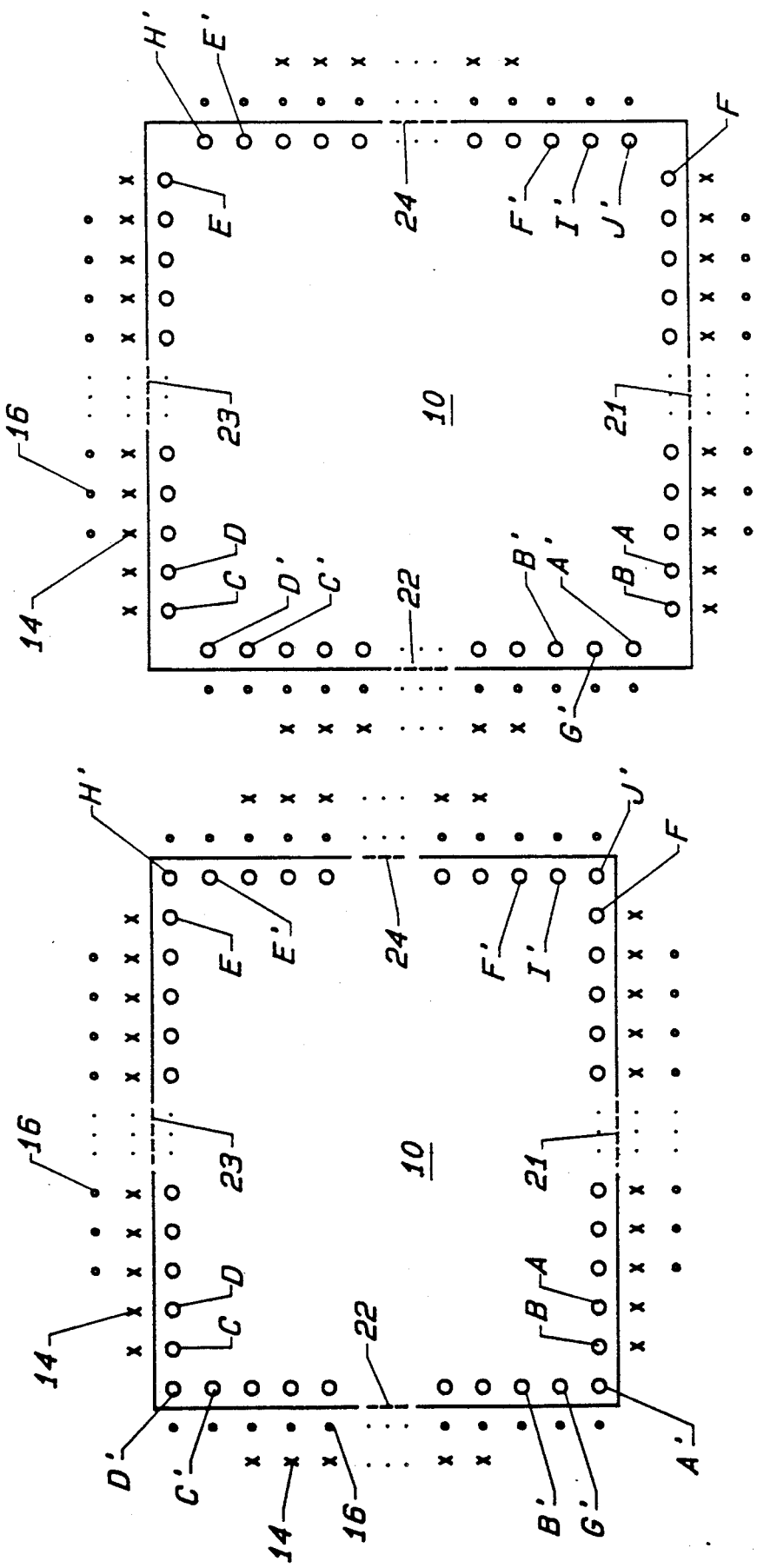

On a typical lead frame, the bonding posts are all located on the four sides of a rectangle. None are on the corner, since the four corner positions of the lead frame are occupied by support leads which have no electrical function, but which mechanically support the die while bonding is being performed. An integrated circuit die often has bonding pads in the corners, however, and these pads can be bonded to posts on either of the two adjacent sides. Referring to the configuration of pads on the die 10 as shown in FIG. 1, the corner pads B, C, E and F, when they are connected to bonding posts in the package, are connected to posts on the sides 21 and 23. Several other configurations of pads are equivalent to this, in the sense that they all have 21 pads accessible to bonding posts on each of sides 22 and 24, and 24 pads accessible to bonding posts on each of sides 21 and 23. FIG. 4A shows one of these configurations. In essence, one can think of the sides 22 and 24 of the FIG. 1 arrangement having been spread outward, and the sides 21 and 23 pushed inward toward the center of the die by one pad distance each. The die still has 21 pads for wire bonding to posts on sides 21 and 23, and 24 pads for wire bonding to posts on sides 22 and 24. Now, however, pads A', D', H' and J' are in the corners. Yet another configuration is that shown in FIG. 4B, where none of the pads are in corners. FIG. 4C shows still another variation, in which pads A', C, H' and F are in the four corners. Other configurations will be apparent.

Referring again to FIG. 1, it can be seen that there is a group of pads on each of the four sides of the die, all of which pads receive bonding wires whether the die is in the 80-pin package or the 84-pin package. These pads are referred to as common pads and are shown bracketed in FIG. 1. Though the common pads on each of the four sides as shown in FIG. 1 are all contiguous, it will be understood that they can just as effectively be interspersed with some of the redundant or extra pads. The only requirement is that the bonding wires do not cross each other and do not come so close to each other as to create an inordinate risk of shorting.

The pads in FIG. 1 which are not common pads are referred to herein as supplemental pads. They include both pads from redundant pairs, as well as extra pads which are typically connected to power nodes. On side 21, a first group of supplemental pads consists of pads A and B, while a second group of supplemental pads consists of only pad F. On side 22, a first group of supplemental pads consists of pads A', G' and B' while a second group of supplemental pads consists of pads C' and D'. On side 23, a first group of supplemental pads consists of pads C and D, while a second group of supplemental pads consists of pad E. On side 24, a first group of supplemental pads consists of pads H' and E', while a second group of supplemental pads consists of pads F', I' and J'.

As shown in FIG. 1, each pad which has a redundant partner has such redundant partner in the adjacent group of supplemental pads. This is not essential, but it is advantageous because it shortens the interconnects which are required to duplicate functions on both pads. Additionally, all of the pads in a given supplemental group have their redundancy partners arranged in the same sequence, counting clockwise around the die, in the adjacent supplemental group. This feature too is unnecessary but advantageous. It is advantageous because if the feature is used, the data sheets for the same product in either of the two packages will list pin functions in the same sequence. Absent this feature, there is a real possibility that a designer using the product in one package will accidentally design his PC card around the pin sequence for the other package.

In the above-described embodiments of the invention, corner pads on the die are each assigned to bond to posts on one or the other of the two adjacent sides of the cavity. It will be understood, however, that a corner pad can be shared. That is, it can be assigned to bond with a post on one of the adjacent sides if the die is in a first package type and to a post on the other of the adjacent sides if the die is in a second package type. An arrangement which uses this technique is shown in FIG. 4D. The corner pads are designated A-A', C-C', E-E' and F-F'. If the die 10 is packaged in the 80-pin package, then pads A-A' and F-F' are bonded to the nearby "X" posts on the side 21 and the pads C-C' and E-E' are bonded to the nearby "X" posts on side 23. If the die 10 is packaged in the 84-pin package, then these corner pads are bonded instead to their nearby posts on sides 22 and 24.

Sharing of corner pads is advantageous since it reduces the total number of pads which need to be fit along the edges of the die. However, it usually forces redundant pads placed in adjacent supplemental groups to lose their sequence. Note that it is entirely up to the designer as to whether a given corner should have a shared pad. There is no necessity that all corners have shared pads whenever one corner does.

In the above-described embodiment of the invention, the total number of bonding posts present in the smaller-pin-count package was 80. All 80 pins performed useful, non-repetitive functions. It will be understood, however, that the integrated circuit may not need 80 connections to the outside world, in which case the total number of pads integrated onto the die may be fewer than 80 and one or more bonding posts on the 80-pin package left unbonded. Alternatively, extra pads may be added to bring the total number of pads up to 80 or more. Like the extra pads G', H', I' and J' in FIG. 1, these extra pads advantageously connect to power nodes on the die. In general, the invention will be useful if the number of pads bonded to posts on one side of the cavity in a first package, which pads must be connected to external package pins, exceeds the number of posts on the corresponding side of the cavity in a second package in which the die is to be placed.

From the above description, it will be seen that an integrated circuit product or products which incorporate the invention likely will have certain characteristics not found in products not incorporating the invention. For example, a die manufactured according to the invention may have redundant signal (as opposed to power) pads, both coupled to the same signal node in the integrated circuit. Applicants are unaware of any other product in which an input, output or I/O signal is duplicated on two or more pads. This is especially true when the die is sealed in a package, and only one pad in each redundant pair is bonded to a post. It is even more true when two dies having a single layout are packaged in two different packages, a first one of each pair of pads on the first die being bonded to posts in the first package, and a second one of each pair of pads on the second die being bonded to posts in the second package.

As another example, a die manufactured according to the invention and sealed in a package may have at least two pairs of redundant pads (whether they be signal, power, or some other type of pads), only one pad in each pair being bonded to a post. When the die is packaged in a different package, a different pad in each pair may be bonded to a post.

In a common, but not exclusive, use of the invention, a first package will have bonding posts disposed accessibly for bonding with pads on the die which are arranged in an $m_1 \times n_1$ rectangle and a second package will have bonding posts disposed accessibly for bonding with pads which are arranged in an $m_2 \times n_2$ rectangle, the die having its pads arranged so that the greater of $m_1$ and $m_2$ pads are on each of two opposite sides, and so that the greater of $n_1$ and $n_2$ pads are on each of the remaining two sides. Other characteristic features of the invention will be apparent.

The invention has been described with respect to particular embodiments thereof, and it will be understood that numerous variations are possible without departing from the scope of the invention. For example, the circuit integrated onto the die may be analog, or of some digital family other than CMOS. Redundant pads may be made redundant by means other than those described above. The die may also be designed according to the invention to accommodate more than two different package types, and one or more of the contemplated packages may have posts disposed on only one, two or three sides adjacent to the cavity instead of four, and round packages may even have posts surrounding the die circularly. The invention is also useful in bump bonding applications, in which pads may be located randomly across the die, or in tape automated bonding (TAB). Note also that the sequence of redundant pads and their location could actually be quite disorderly, unlike the orderly examples described above. That is, a redundant pad may be located anywhere on the chip, even somewhere on the same side as the counterpart pad, if that is appropriate for the bonding post configuration of a contemplated package. Many other variations, all within the scope of the invention, will be apparent to a person of ordinary skill after reading the present specification.

We claim:

1. The combination of an integrated circuit package and an integrated circuit die sealed in the package, the package comprising a plurality of bonding posts surrounding the die, the die being rectangular and having a first side and having a third side opposite the first side, and having second and fourth opposite sides each joining the first and third sides, the die having integrated thereon:
   an integrated circuit having circuit nodes including first, third, fifth and seventh circuit nodes;
   a plurality of bonding pads disposed along the sides of the die, including a first pad accessible for wire bonding with a post on the first side of the die, a second pad accessible for wire bonding with a post on the second side of the die, a third pad accessible for wire bonding with a post on the third side of the die and a fourth pad accessible for wire bonding with a post on the fourth side of the die;
   first coupling means for coupling both the first and second pads to the first circuit node so that external connection to either of the first and second pads achieves the same function as external connection to the other of the first and second pads; and
   third coupling means for coupling both the third and fourth pads to the third circuit node so that external connection to either of the third and fourth pads achieves the same function as external connection to the other of the third and fourth pads,
   wherein the first and third pads are each connected to a bonding post in the package, the first node being coupled to a bonding post in the package only through the first pad, and the third node being coupled to a bonding post in the package only through the third pad;
   wherein the plurality of bonding pads includes a first contiguous group of pads located accessibly for wire bonding with posts on the first side of the die and a second contiguous group of pads located accessibly for wire bonding with posts on the second side of the die, the second contiguous group of pads being adjacent to and distinct from the first contiguous group of pads, the first contiguous group including the first pad and the second contiguous group including the second pad, all of the pads in the first and second contiguous group being coupled to circuit nodes, those circuit nodes which are signal nodes and which are coupled to pads in the first contiguous group being redundantly coupled to pads in the second contiguous group, each of such signal nodes which is coupled to a pad in the first contiguous group being coupled to a bonding post only through such pad in the first contiguous group;
   wherein the plurality of bonding pads further includes a third contiguous group of pads located accessibly for wire bonding with posts on the third side of the die and a fourth contiguous group of pads located accessibly for wire bonding with posts on the fourth side of the die, the fourth contiguous group of pads being adjacent to and distinct from the third contiguous group of pads, the third contiguous group including the third pad and the fourth contiguous group including the fourth pad, all of the pads in the third and fourth contiguous groups being coupled to circuit nodes, those circuit nodes which are signal nodes and which are coupled to pads in the third contiguous group being redundantly coupled to pads in the fourth contiguous group, each of such signal nodes which is coupled to a pad in the third contiguous group being coupled to a bonding post only through such pad in the third contiguous group;
   wherein the second contiguous group includes more pads than the first contiguous group; and
   wherein the second contiguous group includes an extra pad connected to a power node, the power node being connected to a bonding post only through a pad or pads other than the extra pad and other than the pads in the first contiguous group, the extra pad being disposed between two pads in the second contiguous group which are coupled to signal nodes.

2. The combination of claim 1, the plurality of bonding pads further including a fifth pad accessible for wire bonding with a post on the second side of the die, a sixth pad accessible for wire bonding with a post on the third side of the die, a seventh pad accessible for wire bonding with a post on the fourth side of the die and an eighth pad accessible for wire bonding with a post on the first side of the die;

the die further having integrated thereon:

fifth coupling means for coupling both the fifth and sixth pads to the fifth circuit node so that external connection to either of the fifth and sixth pads achieves the same function as external connection to the other of the fifth and sixth pads; and seventh coupling means for coupling both the seventh and eighth pads to the seventh circuit node so that external connection to either of the seventh and eighth pads achieves the same function as external connection to the other of the seventh and eighth pads, wherein the plurality of bonding pads further includes a fifth contiguous group of pads located accessibly for wire bonding with posts on the second side of the die and a sixth contiguous group of pads located accessibly for wire bonding with posts on the third side of the die, the sixth contiguous group being adjacent to and distinct from the fifth contiguous group of pads, the fifth contiguous group including the fifth pad and the sixth contiguous group including the sixth pad, all of the pads in the fifth and sixth contiguous groups being coupled to circuit nodes, those circuit nodes which are signal nodes and which are coupled to pads in the sixth contiguous group being redundantly coupled to pads in the fifth contiguous group, each of such signal nodes which is coupled to a pad in the sixth contiguous group being coupled to a bonding post only through such pad in the sixth contiguous group; and wherein the plurality of bonding pads further includes a seventh contiguous group of pads located accessibly for wire bonding with posts on the fourth side of the die and an eighth contiguous group of pads located accessibly for wire bonding with posts on the first side of the die, the eighth contiguous group being adjacent to and distinct from the seventh contiguous group of pads, the seventh contiguous group including the seventh pad and the eighth contiguous group including the eighth pad, all of the pads in the seventh and eighth contiguous groups being coupled to circuit nodes, those circuit nodes which are signal nodes and which are coupled to pads in the eighth contiguous group being redundantly coupled to pads in the seventh contiguous group, each of such signal nodes which is coupled to a pad in the eighth contiguous group being coupled to a bonding post only through such pad in the eighth contiguous group.

3. The combination of an integrated circuit package and an integrated circuit die sealed in the package, the package comprising a plurality of bonding posts surrounding the die, the die being rectangular and having a first side and a second side adjacent to the first side, the die having integrated thereon:

an integrated circuit having circuit nodes including a first circuit node;

a plurality of bonding pads disposed along the sides of the die, including a first pad accessible for wire bonding with a post on the first side of the die and a second pad accessible for wire bonding with a post on the second side of the die; and first coupling means for coupling both the first and second pads to the first circuit node so that external connection to either of the first and second pads achieves the same function as external connection to the other of the first and second pads, wherein the first pad is connected to a bonding post in the package, the first node being coupled to a bonding post in the package only through the first pad, and wherein the plurality of bonding pads further includes a first corner pad located on the corner between the first and second sides of the die, the first corner pad being distinct from the first and second pads and being connected to a bonding post in the package, the first corner pad being coupled to a first corner pad one of the circuit nodes, the first corner pad one of the circuit nodes being coupled to a bonding post in the package only through the first corner pad.

* * * * *